(12) United States Patent
Lee

(10) Patent No.: US 9,500,899 B2
(45) Date of Patent: Nov. 22, 2016

(54) TRANSISTOR SUBSTRATE, RELATED DISPLAY DEVICE, AND RELATED MANUFACTURING METHOD

(71) Applicant: Samsung Display Co., Ltd., Yongin, Gyeonggi-Do (KR)

(72) Inventor: Yui-Ku Lee, Asan-si (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/849,360

(22) Filed: Sep. 9, 2015

(65) Prior Publication Data
US 2016/0202545 A1 Jul. 14, 2016

(30) Foreign Application Priority Data
Jan. 14, 2015 (KR) .................. 10-2015-0006999

(51) Int. Cl.
| | | |
|---|---|---|
| H01L 27/14 | (2006.01) | |
| H01L 29/04 | (2006.01) | |
| H01L 29/15 | (2006.01) | |
| H01L 31/036 | (2006.01) | |
| G02F 1/1335 | (2006.01) | |
| H01L 27/12 | (2006.01) | |
| G02F 1/1368 | (2006.01) | |
| G02F 1/1362 | (2006.01) | |
| G02F 1/1343 | (2006.01) | |

(52) U.S. Cl.
CPC ....... *G02F 1/133514* (2013.01); *G02F 1/1368* (2013.01); *G02F 1/13624* (2013.01); *G02F 1/133516* (2013.01); *G02F 1/134309* (2013.01); *H01L 27/1214* (2013.01); *H01L 27/1259* (2013.01); *G02F 2001/134345* (2013.01)

(58) Field of Classification Search
CPC .................. G02F 1/133514; G02F 1/13624; G02F 1/1368; G02F 1/134309; G02F 1/133516; G02F 2001/134345; H01L 27/1259; H01L 27/1214
See application file for complete search history.

(56) References Cited

U.S. PATENT DOCUMENTS

| | | | | |
|---|---|---|---|---|
| 5,994,721 A | * | 11/1999 | Zhong | G02F 1/136213 257/440 |
| 6,707,067 B2 | | 3/2004 | Zhong et al. | |
| 7,227,185 B2 | | 6/2007 | Lin | |
| 7,400,366 B2 | | 7/2008 | Chang et al. | |
| 7,443,465 B2 | * | 10/2008 | Kim | G02F 1/133514 349/106 |
| 8,149,372 B2 | | 4/2012 | Lee et al. | |
| 2004/0125277 A1 | * | 7/2004 | Kim | G02F 1/136209 349/106 |
| 2004/0252271 A1 | * | 12/2004 | Song | G02F 1/13394 349/155 |
| 2006/0232529 A1 | * | 10/2006 | Midorikawa | G02F 1/133514 345/87 |
| 2009/0225017 A1 | * | 9/2009 | Kim | G02F 1/133514 345/88 |
| 2010/0123860 A1 | * | 5/2010 | Kim | G02F 1/133516 349/106 |
| 2010/0157211 A1 | * | 6/2010 | Kim | G02F 1/133516 349/106 |
| 2013/0313530 A1 | * | 11/2013 | Seo | H01L 29/66969 257/40 |
| 2014/0354924 A1 | * | 12/2014 | Byun | G02F 1/133514 349/106 |
| 2015/0198842 A1 | * | 7/2015 | Kwak | G02F 1/136209 349/42 |

FOREIGN PATENT DOCUMENTS

| | | |
|---|---|---|
| KR | 10-0652406 | 12/2006 |
| KR | 10-0709204 | 4/2007 |
| KR | 10-1108004 | 1/2012 |
| KR | 10-1197221 | 11/2012 |

* cited by examiner

*Primary Examiner* — Victor A Mandala
(74) *Attorney, Agent, or Firm* — Innovation Counsel LLP

(57) ABSTRACT

A transistor substrate may include a transistor. The transistor substrate may further include a set of color filters that has at least two different colors, overlaps the transistor, and defines a hole. The hole exposes a portion of the transistor.

20 Claims, 8 Drawing Sheets

TRANSISTOR SUBSTRATE, RELATED DISPLAY DEVICE, AND RELATED MANUFACTURING METHOD

CROSS-REFERENCE TO RELATED APPLICATION

This application claims priority to and the benefit of Korean Patent Application No. 10-2015-0006999 filed in the Korean Intellectual Property Office on Jan. 14, 2015; the entire contents of the Korean Patent Application are incorporated herein by reference.

BACKGROUND (a) Field

The technical field is related to a thin film transistor substrate and a method for manufacturing the thin film transistor substrate.

(b) Description of Related Art

A liquid crystal display device may include two panels with field generating electrodes (such as a pixel electrode and a common electrode) and may include a liquid crystal layer disposed between the field generating electrodes. A voltage may be applied to at least one of the field generating electrodes to generate an electric field on the liquid crystal layer to control directions of liquid crystal molecules of the liquid crystal layer, for controlling transmission of incident light through the liquid crystal layer, in order to display an image. The liquid crystal display device may further include color filters for providing colors the displayed image. The liquid crystal display device may further include transistors for controlling transmission of signals in the liquid crystal display device. The above information disclosed in this Background section is for enhancement of understanding of the background. The Background section may contain information that does not form the prior art that is already known in this country to a person of ordinary skill in the art.

SUMMARY

An embodiment may be related to a transistor substrate, which may include a transistor. The transistor substrate may further include a set of color filters that has at least two different colors, overlaps the transistor, and defines a hole. The hole exposes a portion of the transistor without completely exposing a side of the transistor (in a plan view of the transistor substrate).

The transistor substrate may include a pixel electrode that overlaps the set of color filters. A portion of the pixel electrode may be positioned inside the hole, may directly contact the color filters, and may directly contact the portion of the transistor.

The set of color filters may include a first first-color filter and a first second-color filter. A color of the first first-color filter may be different from a color of the first second-color filter. The first first-color filter may directly abut the first second-color filter in a plan view of the transistor substrate. The first first-color filter may define (and/or provide) a first side of the hole in the plan view of the transistor substrate. The first second-color filter may define (and/or provide) a second side of the hole in the plan view of the transistor substrate.

The first first-color filter may be longer than the first second-color filter according to a first direction.

Each of the first first-color filter and the first second-color filter may be positioned between two display-area color filters in the plan view of the transistor substrate. The first first-color filter may directly abut each of the two display-area color filters in the plan view of the transistor substrate. Each of the two display-area color filters may be wider than each of the first first-color filter and the first second-color filter according to a second direction. The second direction may be perpendicular to the first direction.

A thickness of one or each of the two display-area color filters may be unequal to at least one of a thickness of the first first-color filter and a thickness of the first second-color filter.

The set of color filter further may include a second first-color filter. The second first-color filter may directly abut the first second-color filter in the plan view of the transistor substrate. The second first-color filter may define (and/or provide) a third side of the hole in the plan view of the transistor substrate. The hole and the first second-color filter may be positioned between the first first-color filter and the second first-color filter in the plan view of the transistor substrate.

The set of color filter further may include a second second-color filter. The second second-color filter may be positioned between the first first-color filter and the second first-color filter in the plan view of the transistor substrate. The second second-color filter may directly abut each of the first first-color filter and the second first-color filter in the plan view of the transistor substrate. The second second-color filter may define (and/or provide) a fourth side of the hole in the plan view of the transistor substrate.

The first first-color filter may overlap a gate electrode of the transistor.

An embodiment may be related to a method for manufacturing a transistor substrate. The method may include the following steps: forming a transistor on a base substrate; and forming a set of color filters that has at least two different colors, may overlap the transistor, and defines a hole, the hole exposing a portion of the transistor without completely exposing a side of the transistor (in a plan view of the transistor substrate).

The method may include forming a pixel electrode that overlaps the set of color filters. A portion of the pixel electrode may be positioned inside the hole, may directly contact the color filters, and may directly contact the portion of the transistor.

The set of color filters may include a first first-color filter and a first second-color filter. A color of the first first-color filter may be different from a color of the first second-color filter. The first first-color filter may directly abut the first second-color filter in a plan view of the transistor substrate. The first first-color filter may define (and/or provide) a first side of the hole in the plan view of the transistor substrate. The first second-color filter may define (and/or provide) a second side of the hole in the plan view of the transistor substrate.

The first first-color filter may be longer than the first second-color filter according to a first direction.

The method may include forming two display-area color filters. Each of the first first-color filter and the first second-color filter may be positioned between the two display-area color filters in the plan view of the transistor substrate. The first first-color filter may directly abut each of the two display-area color filters in the plan view of the transistor substrate. Each of the two display-area color filters may be wider than each of the first first-color filter and the first second-color filter according to a second direction. The second direction may be perpendicular to the first direction.

A thickness of one or each of the two display-area color filters may be unequal to at least one of a thickness of the first first-color filter and a thickness of the first second-color filter.

A thickness of one or each of the two display-area color filters may be equal to a sum of a thickness of the first first-color filter and a thickness of the first second-color filter.

A color of the two display-area filters may be different from each of the color of the first first-color filter and the color of the first second-color filter.

The first first-color filter may overlap a gate electrode of the transistor.

An embodiment may be related to a display device. The display device may include the following elements: a first transistor; a first first-color filter; a first second-color filter, which may directly abut the first first-color filter in a plan view of the display device, wherein a color of the first first-color filter may be different from a color of the first second-color filter; and a first subpixel electrode, which may directly contact each of the first transistor, the first first-color filter, and the first second-color filter.

The display device may further include the following elements: a second transistor; a second second-color filter, which may directly abut the first first-color filter in the plan view of the display device, wherein a color of the second second-color filter may be identical to a color of the first second-color filter; and a second subpixel electrode, which may directly contact each of the second transistor, the first first-color filter, and the second second-color filter.

An embodiment may be related to a thin film transistor substrate that includes the following elements: a switching element disposed on a thin film transistor region on a substrate; and a color filter layer exposing a portion of the switching element through a hole surrounded by a plurality of color filters corresponding to different colors.

The thin film transistor substrate may further include the following element: a pixel electrode disposed on a display area on the substrate, and contacting the portion of the switching element through the hole surrounded by the color filters corresponding to the different colors.

The color filter layer may include a color filter formed corresponding to the display area.

A color of the color filter formed corresponding to the display area may be different from a color of the plurality of color filters exposing the portion of the switching element.

A color of the color filter formed corresponding to the display area may be identical to a color of at least one of the plurality of color filters exposing the portion of the switching element.

A thickness of the color filter formed corresponding to the display area may be different from a thickness of a portion of the plurality of color filters exposing the portion of the switching element.

The plurality of color filters may be formed using different masks.

The plurality of color filters may include a first color filter and a second color filter, wherein the first color filter extends in a first direction, and the second color filter extends in a second direction intersecting the first direction.

The switching element comprises an input terminal, an output terminal, and a control terminal, and the portion of the switching element is a portion of at least one of the input terminal or the output terminal.

An embodiment may be related to a method for manufacturing a thin film transistor substrate. The method may include the following steps: forming a switching element on a region on which a thin film transistor is formed, on substrate; and forming a color filter layer exposing a portion of the switching element through a hole surrounded by a plurality of color filters corresponding to different colors.

The method may further include the following step: forming, on a display area on the substrate, a pixel electrode contacting the portion of the switching element through the hole surrounded by the color filters corresponding to the different colors.

The forming of the color filter layer may include forming a color filter corresponding to the display area.

A color of the color filter formed corresponding to the display area may be different from a color of the plurality of color filters exposing the portion of the switching element.

A color of the color filter formed corresponding to the display area may be identical to a color of at least one of the plurality of color filters exposing the portion of the switching element.

A thickness of the color filter formed corresponding to the display area may be different from a thickness of a portion of the plurality of color filters exposing the portion of the switching element.

The forming of the color filter may include the following steps: forming a first color filter of the plurality of color filter exposing the portion of the switching element using a first mask substrate; and forming a second color filter of the plurality of color filters exposing the portion of the switching element using a second mask substrate.

The first color filter and the second color filter may overlap each other around the portion of the switching element.

The first color filter may extend a first direction, and the second color filter extends in a second direction intersecting the first direction.

The forming of the switching element may include the following steps: forming a control terminal of the switching element; and forming an input terminal and an output terminal of the switching element, wherein the portion of the switching element exposed through the hole surrounded by the plurality of color filters corresponding to the different colors is a portion of at least one of the input terminal or the output terminal.

According to embodiments, contact holes may be formed through color filter formation process steps (without significant additional steps). Advantageously, efficiency associated with a process for manufacturing a transistor substrate and/or a process for manufacturing a display device may be optimized.

According to embodiments, locations and dimensions of contact holes may be determined by configuring locations and distances between color filters. Advantageously, precision of contact hole locations and dimensions may be optimized, and an aperture ratio of the associated display device may be optimized.

DETAILED DESCRIPTION OF EMBODIMENTS

Figure 1:
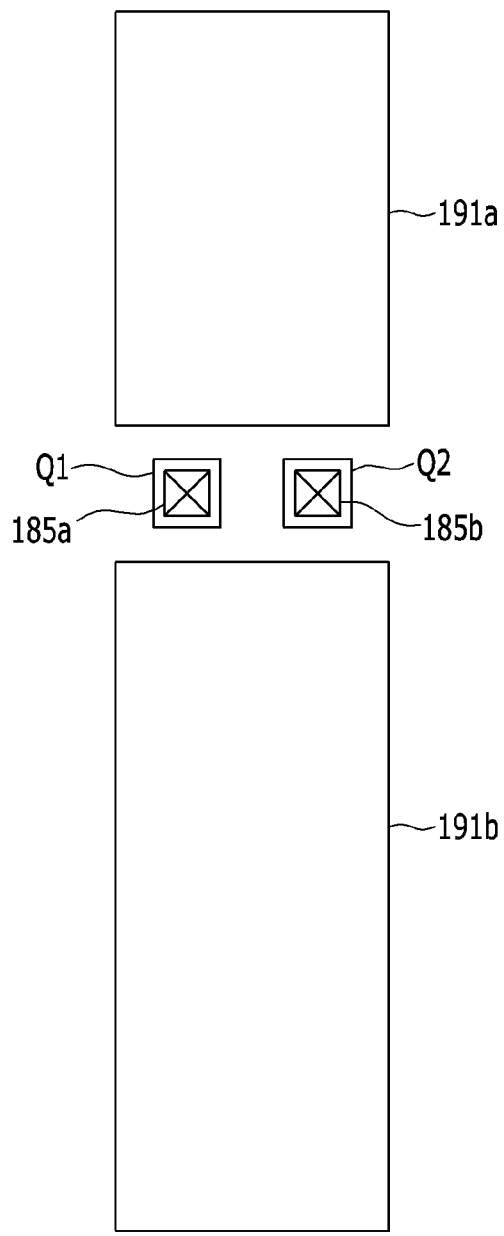
FIG. 1 is a schematic (top) plan view illustrating a structure in a thin film transistor substrate according to an embodiment.

Embodiments are described with reference to the accompanying drawings. Like reference numerals may be assigned to identical or similar elements, and description related to identical or similar elements may not be repeated.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

When a first element is referred to as being "on", "connected to", or "coupled to" a second element, the first element may be directly on, connected to, or coupled to the second constituent element, or at least an intervening element may be present. In contrast, when a first element is referred to as being "directly connected to" or "directly coupled to" a second element or layer, no intended intervening elements are present between the first element and the second element.

Singular forms may include plural forms as well, unless the context clearly indicates otherwise.

In this application, a color filter may mean a stand-alone color filter unit and may mean a color filter portion of a color filter member that is directly connected to another color filter portion of the color member.

In the drawings, thicknesses of layers, films, panels, regions, etc., may be exaggerated for clarity.

FIG. 1 is a schematic (top) plan view illustrating a structure associated with a pixel in a thin film transistor substrate according to an embodiment. The thin film transistor substrate may be included in a display device, e.g., a liquid crystal display device, and may include a plurality of pixels and a plurality of signal lines. The pixels may correspond to pixels of the display device. The signal lines may include a gate line, a data line, a division reference voltage line, a storage voltage line, etc., which may be known in the art and are not shown in FIG. 1.

As illustrated in FIG. 1, one pixel of the thin film transistor substrate may include subpixel electrodes 191*a* and 191*b* and may include switching elements Q1 and Q2.

The subpixel electrodes 191*a* and 191*b* may enable the corresponding pixel in the liquid crystal display to have domains having different alignment directions of liquid crystal molecules, such that a desirable viewing angle may be attained.

The switching elements Q1 and Q2 may thin film transistors and may be connected to corresponding gate lines, data lines, and subpixel electrodes 191*a* and 191*b*. The switching elements Q1 and Q2 may be turned on or turned off according to signals applied to the gate lines. Voltages may be applied to the subpixel electrodes 191*a* and 191*b* when the switching elements Q1 and Q2 are turned on. The subpixel electrodes 191*a* and 191*b* may be electrically connected to the switching elements Q1 and Q2 through contact holes 185*a* and 185*b*.

Figure 2:
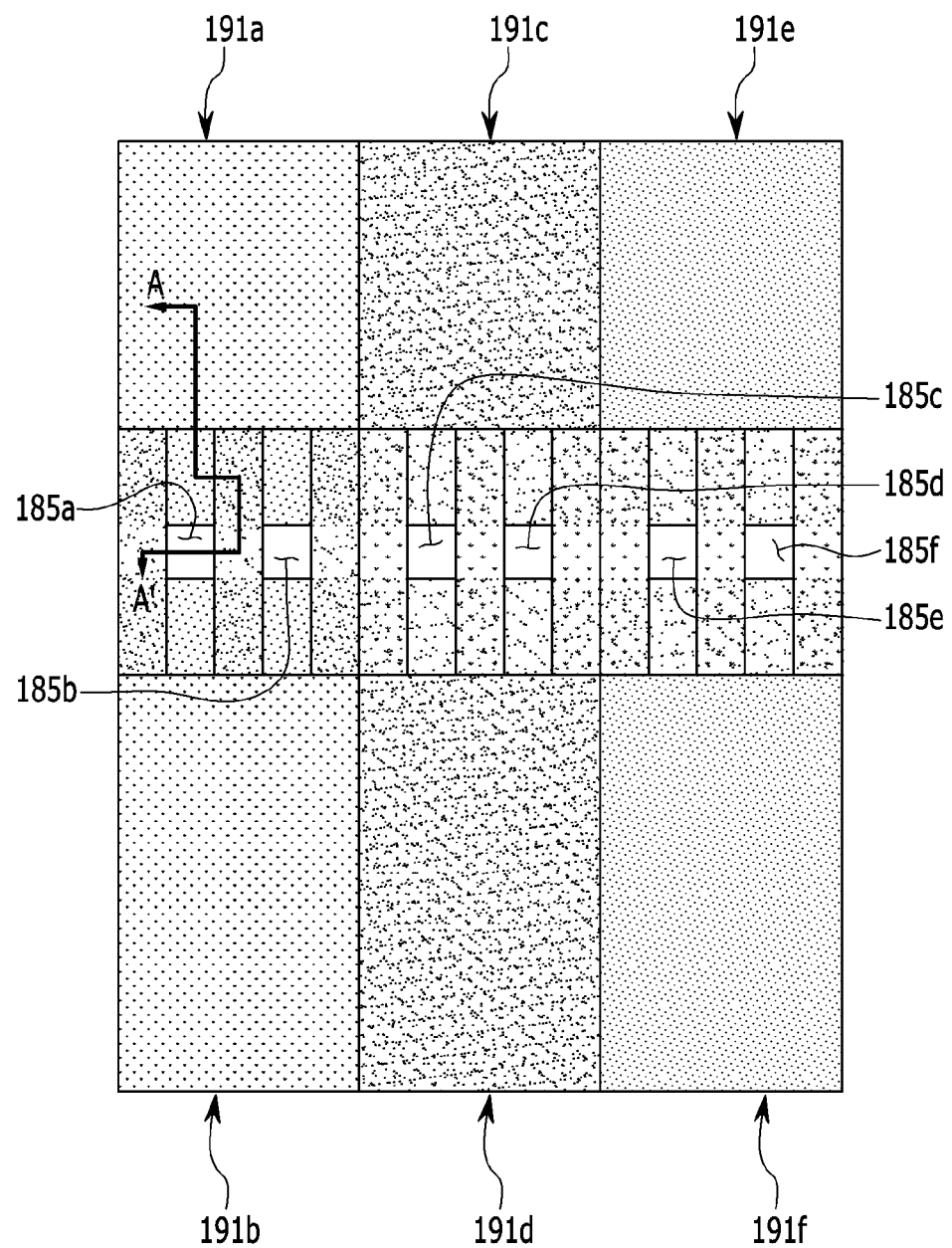
FIG. 2 is a schematic (top) plan view illustrating a structure in a liquid crystal display device that includes a thin film transistor substrate according to an embodiment.
Figure 3:
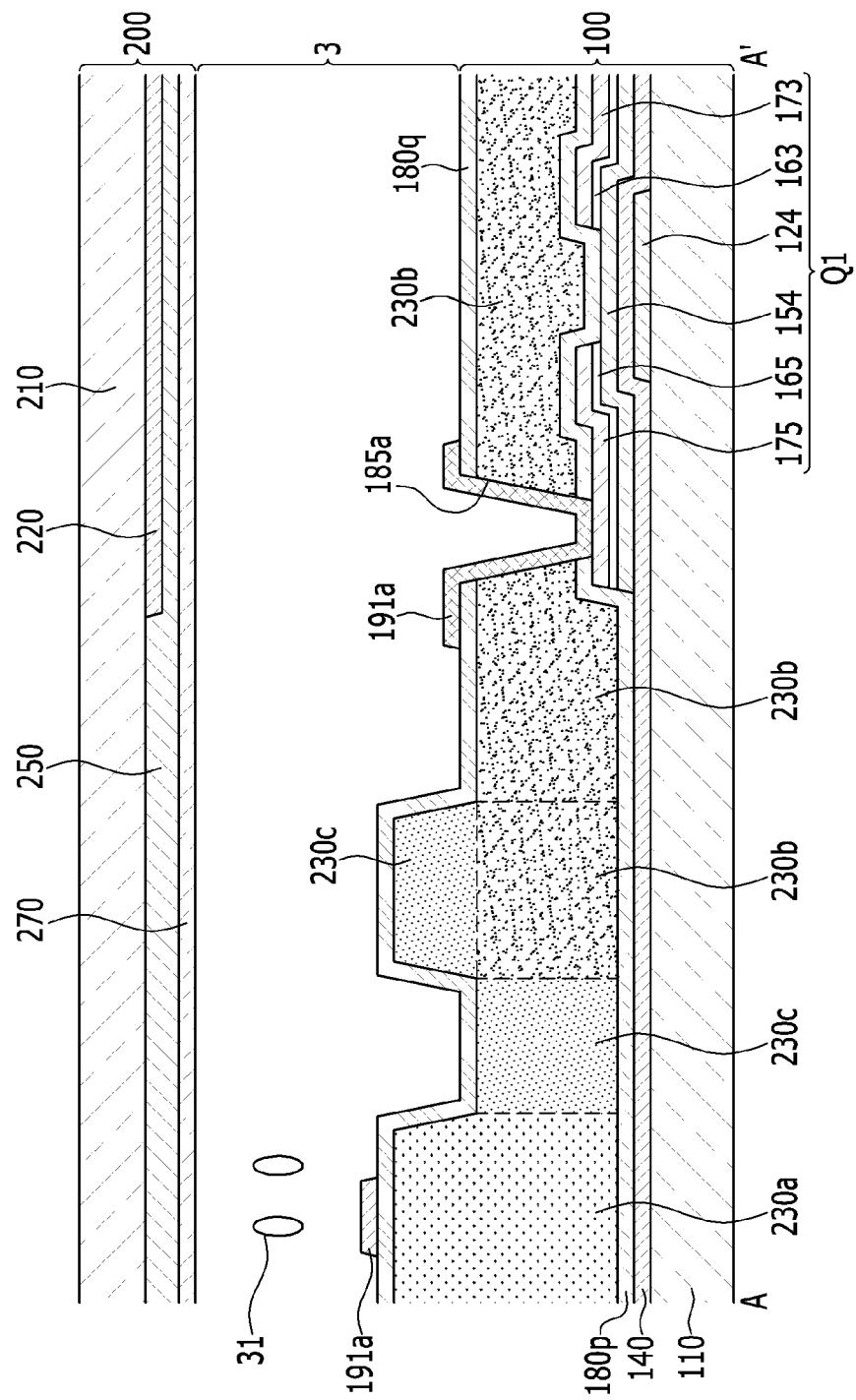
FIG. 3 is a schematic cross-sectional view taken along line A-A' indicated in FIG. 2 according to an embodiment.

FIG. 2 is a schematic (top) plan view illustrating a structure associated with three pixels in a liquid crystal display device that includes a thin film transistor substrate according to an embodiment. FIG. 3 is a schematic cross-sectional view taken along line A-A' indicated in FIG. 2 according to an embodiment. Each of the three pixels may extend in a first direction, which may be a pixel column direction. The three pixels may respectively include subpixel electrodes 191*a* and 191*b*, subpixel electrodes 191*c* and 191*d*, and subpixel electrodes 191*e* and 191*f*. A color filter layer that includes color filters may be positioned in the pixels. The color filters may display primary colors, such as red, green, and blue, and may extend in the first direction.

The subpixel electrodes 191*a* and 191*b* may be aligned with each other in the first direction and may overlap two first-color filters, e.g., two red filters, which may be aligned with each other in the first direction. The subpixel electrodes 191*c* and 191*d* may be aligned with each other in the first direction and may overlap two second-color filters, e.g., two green filters, which may be aligned with each other in the first direction. The subpixel electrodes 191*e* and 191*f* may be aligned with each other in the first direction and may overlap two third-color filters, e.g., two blue filters, which may be aligned with each other in the first direction.

Contact holes 185*a*, 185*b*, 185*c*, 185*d*, 185*e*, and 185*f* may enable the subpixel electrodes 191*a*, 191*b*, 191*c*, 191*d*, 191*e*, and 191*f* to be electrically connected to corresponding switching elements. Each of the contact holes 185*a*, 185*b*, 185*c*, 185*d*, 185*e*, and 185*f* may be surrounded by color filters having and/or corresponding to at least two primary colors. As an example, the contact hole 185*a* may enable the subpixel electrode 191*a* to contact and connect to the switching element Q1. The contact hole 185*a* may be surrounded by two second-color filters and two third-color filters. The contact hole 185*a* may be positioned between the two second-color filters in a second direction perpendicular to the first direction and may be positioned between the two third-color filters in the first direction. The two second-color filters may be longer than the two third-color filters in the first direction. The contact hole 185*b* may enable the subpixel electrode 191*b* to contact and connect to the switching element Q2. The contact hole 185*b* also may be positioned between two second-color filters in the second direction and positioned between two third-color filters in the first direction. A second-color filter may be positioned between the contact holes 185*a* and 185*b*.

As another example, the contact hole 185*c* may enable the subpixel electrode 191*c* to contact and connect to a corresponding switching element. The contact hole 185*c* may be surrounded by two first-color filters and two second-color filters. The contact hole 185*c* may be positioned between the two first-color filters in the second direction and may be positioned between the two second-color filters in the first direction. The contact hole 185*d* may enable the subpixel electrode 191d to contact and connect to a corresponding switching element. The contact hole 185d also may be positioned between two first-color filters in the second direction and positioned between two second-color filters in the first direction. A first-color filter may be positioned between the contact holes 185c and 185d.

As another example, the contact hole 185e may enable the subpixel electrode 191e to contact and connect to a corresponding switching element. The contact hole 185e may be surrounded by two first-color filters and two second-color filters. The contact hole 185e may be positioned between the two first-color filters in the second direction and may be positioned between the two second-color filters in the first direction. The contact hole 185f may enable the subpixel electrode 191f to contact and connect to a corresponding switching element. The contact hole 185f also may be positioned between two first-color filters in the second direction and positioned between two second-color filters in the first direction. A first-color filter may be positioned between the contact holes 185e and 185f.

Sides of the contact holes 185a, 185b, 185c, 185d, 185e, and 185f may be defined by associated color filters. Sizes of the contact holes 185a, 185b, 185c, 185d, 185e, and 185f may be designed by configuring distances between associated color filters. For example, dimensions of the contact hole 185a may be designed by configuring a distance between the two associated second-color filters and configuring a distance between the two associated third-color filters.

Referring to FIG. 3, the liquid crystal display device includes a lower panel 100 (or thin film transistor substrate 100), an upper panel 200, and a liquid crystal layer 3 interposed between the two panels 100 and 200. The liquid crystal display device may include a pair of polarizers (not shown) attached to outer surfaces of the panels 100 and 200.

A switching element Q1 is positioned on an insulation substrate 110, which may be made of one or more of transparent glass, transparent plastic, etc. A gate layer 124 (or gate electrode 124) of the switching element Q1 is formed on the insulation substrate 110. A gate insulating layer 140 is disposed on the gate layer 124.

A semiconductor 154 is disposed on the gate insulating layer 140. Ohmic contacts 163 and 165 are disposed on the semiconductor 154.

Data conductors including a source layer 173 (or source electrode 173) and a drain layer 175 (or drain electrode 175) may be disposed on the ohmic contacts 163 and 165 and may overlap the gate insulating layer 140.

The data conductors, the semiconductor, and the ohmic contacts may be substantially simultaneously formed in a same process step using one mask.

The switching element Q1 may be a thin film transistor (TFT) that includes the gate layer 124, the source layer 173, and the drain layer 175. A channel of the thin film transistor is positioned in the semiconductor 154 between the source layer 173 and the drain layer 175.

A first passivation layer 180p is disposed on the data conductors 173 and 175 and on an exposed portion of the semiconductor 154. The first passivation layer 180p may include an inorganic insulating layer formed of an inorganic material, such as silicon nitride or silicon oxide. The first passivation layer 180p may prevent a pigment of a color filter form flowing into the exposed portion of the semiconductor 154.

Referring to FIG. 3, FIG. 4A, FIG. 4B, and FIG. 4C, a color filter layer including first-color filters 230a, second-color filters 230b, third-color filters 230c, first-color filters 231a, second-color filters 231b, and third-color filter 231c is disposed on the first passivation layer 180p. Thicknesses of the color filters may be different according to respective positions.

For example, the first-color filters 230a may have a first thickness and may respectively overlap the subpixel electrodes 191a and 191b. Two second-color filters 231b may respectively have a second thickness and a third thickness, which are less than the first thickness, and may be respectively disposed at two opposite sides of the contact holes 185a. A third-color filter 231c and a second-color filter 231c may overlap each other and may have a combined thickness substantially equal to the first thickness. A thickness of a second-color filter 231b may be substantially equal to a thickness of a third-color filter 231c and may be less than the first thickness. A second passivation layer 180q is disposed on the color filter layer.

The second passivation layer 180q may include an inorganic insulating layer, such as a silicon nitride layer or a silicon oxide layer. The second passivation layer 180q may prevent the liquid crystal layer 3 from being contaminated by an organic material (such as a solvent) potentially flowing from the color filter layer, for preventing unwanted effects, such as an afterimage.

The contact hole 185a may be positioned through the first passivation layer 180p and the second passivation layer 180q. The contact hole 185 may expose the drain electrode 175.

Subpixel electrodes, including the subpixel electrodes 191a and 191b, are disposed on the second passivation layer 180q. The subpixel electrodes may be formed of a transparent material, such as ITO or IZO, and/or a reflective material, such as aluminum, silver, chromium, or an alloy of some of these metals.

The subpixel electrode 191a is directly and electrically connected to the drain electrode 175 through the contact hole 185. The subpixel electrode 191a may receive a data voltage from the drain electrode 175.

The subpixel electrode 191a may form an electric field together with a common electrode 270, which is positioned at the upper panel 200, to determine a direction of liquid crystal molecules of the liquid crystal layer 3 between the electrodes 191a and 270. Luminance of light passing through the liquid crystal layer 3 may depend on directions of liquid crystal molecules of the liquid crystal layer 3.

A lower alignment layer (not shown) is disposed on the subpixel electrodes. The lower alignment layer may be a vertical alignment layer and may be formed of a polyamic acid, polysiloxane, or polyimide.

A light blocking member 220 is positioned on an insulation substrate 210, which may be made of at least one of transparent glass, transparent plastic, etc. The light blocking member 220 may be a black matrix and may prevent light leakage.

The light blocking member 220 may substantially cover the transistor Q1 and the contact hole 185, may extend parallel to a gate line, and may overlap at least a portion of two data lines positioned at two sides of one pixel area. The light blocking member 220 may prevent light leakage around data lines and gate lines and may prevent light leakage in a region where the transistor Q1 is disposed.

An overcoat 250 may be positioned on the black matrix 220. The overcoat 250 may be made of an (organic) insulating material and may provide a flat surface. The overcoat 250 may be omitted. The common electrode 270 is positioned on the overcoat 250.

An upper alignment layer (not shown) is formed on the common electrode 270. The upper alignment layer may be a vertical alignment layer.

Figure 4A:
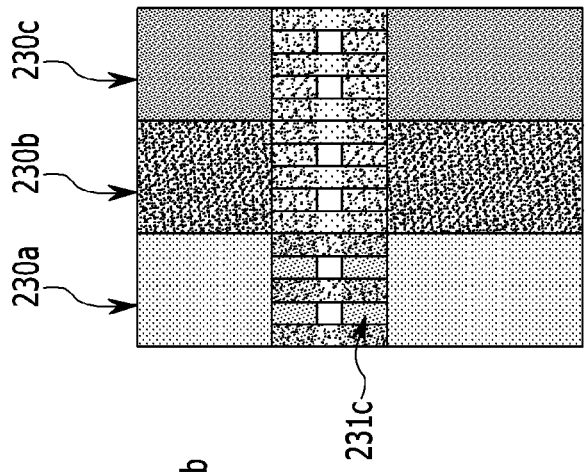
FIG. 4A, FIG. 4B, and FIG. 4C are schematic (top) plan views illustrating steps in a method for manufacturing a thin film transistor substrate according to an embodiment.
Figure 4B:
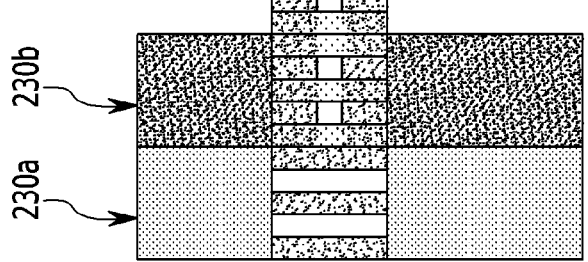
Figure 4C:
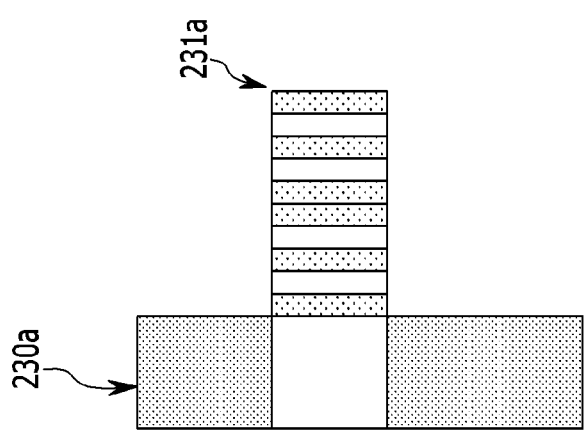

The liquid crystal layer 3 has a negative dielectric constant anisotropy. Major axes of the liquid crystal molecules may be oriented perpendicular to outer surfaces of the two panels 100 and 200 when no electric field is applied to the liquid crystal layer 3. FIG. 4A, FIG. 4B, and FIG. 4C are schematic (top) plan views illustrating steps in a method for manufacturing the lower panel 100 (or thin film transistor substrate 100) according to an embodiment.

Referring to FIG. 4A, through a first mask process, two first-color filters 230a are respectively formed at regions corresponding to the subpixel electrodes 191a and 191b of the first pixel, and first-color filters 231a are formed at regions corresponding to switching elements of the second pixel and the switching elements of the third pixel, such that the first-color filters 231a overlap the switching elements of the second pixel and the switching elements of the third pixel.

The two first-color filters 230a may be aligned in the first direction (e.g., a pixel column direction). The first-color filters 231a may be first-color strips, may be distributed along the second direction, may each extend in the first direction, may extend parallel to each other, and/or may be spaced from each other. The first mask process may include the following steps: providing a photosensitive first-color resin on the first passivation layer 180p (and/or on the substrate 110); positioning a first mask on the first-color resin; applying a first light through the first mask to the first-color resin; and completely or partially removing portions of the first-color resin that have been exposed to the first light.

The first mask may include first-set substantially opaque portions, first-set intensity-reducing portions, and first-set substantially transparent portions.

The first-set substantially opaque portions may shield portions of the first-color resin that form the first-color filters 230a. Therefore, the first-color filters 230a may remain after the first mask process. In an embodiment, the first-set substantially opaque portions may shield some portions of the first-color resin positioned at a region corresponding to switching elements of the second pixel and/or a region corresponding to switching elements of the second pixel and/or a region corresponding to switching elements of the second pixel the third pixel.

The first-set intensity-reducing portions may reduce intensity of portions of the first light applied to portions of the first-color resin that form the first-color filters 231a. Therefore, the first-color filters 231a may remain after the first mask process and may be thinner than the first-color filters 230a. The first-set intensity-reducing portions may include transflective portions, may have slit structures for diffracting incident light, and/or may include translucent portions. The first-set intensity-reducing portions may reduce light intensity by ⅔.

The first-set substantially transparent portions may substantially expose the following portions of the first-color resin to the first light: portions of the first-color resin between the first-color filters 230a; portions of the first-color resin between the first-color filters 231a; and portions of the first-color resin corresponding to the subpixels 191c, 191d, 191e, and 191f. The substantially exposed portions may be substantially removed through the first mask process.

Referring to FIG. 4B, through a second mask process, two second-color filters 230b are respectively formed at regions corresponding to the subpixel electrodes 191c and 191d of the second pixel, and second-color filters 231b are formed at regions corresponding to switching elements of the first pixel, the second pixel, and the third pixel, such that the second-color filters 231b overlap the switching elements.

The two second-color filters 230b may be aligned in the first direction (e.g., a pixel column direction). Some of the second-color filters 231b may be positioned between the two first-color filters 230a, may be second-color strips, may extend in the first direction, may be distributed along the second direction, may extend parallel to each other, and/or may be spaced from each other. Holes corresponding to contact holes 185c, 185d, 185e, and 185f may be formed in a portion of the second-color filters 231b positioned between the second-color filters 230b and a portion of the second-color filters 231b positioned in a region corresponding to the switching elements of the third pixel.

The second mask process may include the following steps: providing a photosensitive second-color resin on the first-color filters 230a and 231a and exposed portions of the first passivation layer 180p (and/or on the substrate 110); positioning a second mask on the second-color resin; applying a second light through the second mask to the second-color resin; and completely or partially removing portions of the second-color resin that have been exposed to the second light.

The second mask may include second-set substantially opaque portions, second-set intensity-reducing portions, and second-set substantially transparent portions.

The second-set substantially opaque portions may shield portions of the second-color resin that form the two second-color filters 230b and may shield some portions of the second-color resin positioned in regions corresponding to switch elements of the second pixel and/or switch elements of the third pixel. Therefore, the two second-color filters 230b may remain after the second mask process, some portions of the second-color filters 231b may exist between the two second-color filters 230b, and some portions of the second-color filters 231b may exist at the region correspond to switching elements of the third pixel. In an embodiment, the second-set substantially opaque portions may shield some portions of the second-color resin positioned at regions corresponding to switching elements of the first pixel.

The second-set intensity-reducing portions may be positioned between the first-color filters 230a in a plan view of the process structure and may reduce intensity of portions of the second light applied to portions of the second-color resin that form potions the second-color filters 231b between the first-color filters 230a. Therefore, the portions of the second-color filters 231b may remain between the first-color filters 230a after the second mask process and may be thinner than the second-color filters 230b. The second-set intensity-reducing portions may include transflective portions, may have slit structures for diffracting incident light, and/or may include translucent portions. The second-set intensity-reducing portions may reduce light intensity by ⅔. In an embodiment, portions of the second-set intensity-reducing portions may be positioned at a region corresponding to switching elements of the second pixel and/or a region corresponding to switching elements of the second pixel.

The second-set substantially transparent portions may substantially expose the following portions of the second-color resin to the second light: portions of the second-color resin corresponding to contact holes 185c, 185d, 185e, and 185f; portions of the second-color resin between the second-color filters 231b; and portions of the second-color resin corresponding to subpixels 191a, 191b, 191e, and 191f. The substantially exposed portions may be substantially removed through the second mask process.

Referring to FIG. 4C, through a third mask process, two third-color filters 230c are respectively formed at regions corresponding to the subpixel electrodes 191e and 191f of the third pixel, and third-color filters 231c are formed between the first-color filters 230a at a region corresponding to the switching elements of the first pixel.

The two third-color filters 230c may be aligned in the first direction (e.g., a pixel column direction). The third-color filters 231c may be positioned between the first-color filters 230a, may be third-color strips, may extend in the first direction, may be distributed along the second direction, may extend parallel to each other, and/or may be spaced from each other. Holes corresponding to the contact holes 185a and 185b may be formed between the third-color filters 231c.

The third mask process may include the following steps: providing a photosensitive third-color resin on the color filters 230a, 231a, 230b, 231b, and exposed portions of the first passivation layer 180p (and/or on the substrate 110); positioning a third mask on the third-color resin; applying a third light through the third mask to the third-color resin; and completely or partially removing portions of the third-color resin that have been exposed to the third light.

The third mask may include third-set substantially opaque portions, third-set intensity-reducing portions, and third-set substantially transparent portions.

The third-set substantially opaque portions may shield portions of the third-color resin that form the two third-color filters 230c. Therefore, the two third-color filters 230c may remain after the third mask process. In an embodiment, the third-set substantially opaque portions may shield some portions of the third-color resin positioned between the first-color filters 230a at regions corresponding to switching elements of the first pixel, such that the third-color filters 231c may be formed between the first-color filters 230a.

The third-set intensity-reducing portions may be positioned between the first-color filters 230a in a plan view of the process structure and may reduce intensity of portions of the third light applied to portions of the third-color resin that form the third-color filters 231c between the first-color filters 230a. Therefore, the third-color filters 231b may remain between the first-color filters 230a after the third mask process and may be thinner than the third-color filters 230c. The third-set intensity-reducing portions may include transflective portions, may have slit structures for diffracting incident light, and/or may include translucent portions. The third-set intensity-reducing portions may reduce light intensity by ⅔.

The third-set substantially transparent portions may substantially expose the following portions of the third-color resin to the third light: portions of the third-color resin corresponding to the contact holes 185a and 185b; portions of the third-color resin between the third-color filters 231c; portions of the third-color resin between the second-color filters 230b; portions of the third-color resin positioned at region corresponding to the switching elements of the third pixel; and portions of the third-color resin corresponding to subpixels 191a, 191b, 191c, and 191d. The substantially exposed portions may be substantially removed through the third mask process.

As can be appreciated from the above discussion with reference to FIG. 1, FIG. 2, FIG. 3, FIG. 4A, FIG. 4B, and FIG. 4C, color filters 230a, 230b, and 230c are formed at regions corresponding to pixel electrodes 191a, 191b, 191c, 191d, 191e, and 191f; color filters 231a, 231b, and 231c may be formed at regions corresponding to switching elements of the three pixels; and the contact holes 185a, 185b, 185c, 185d, 185e, and 185f may be formed in and/or between the color filters 231a, 231b, and/or 231c.

Figure 5:
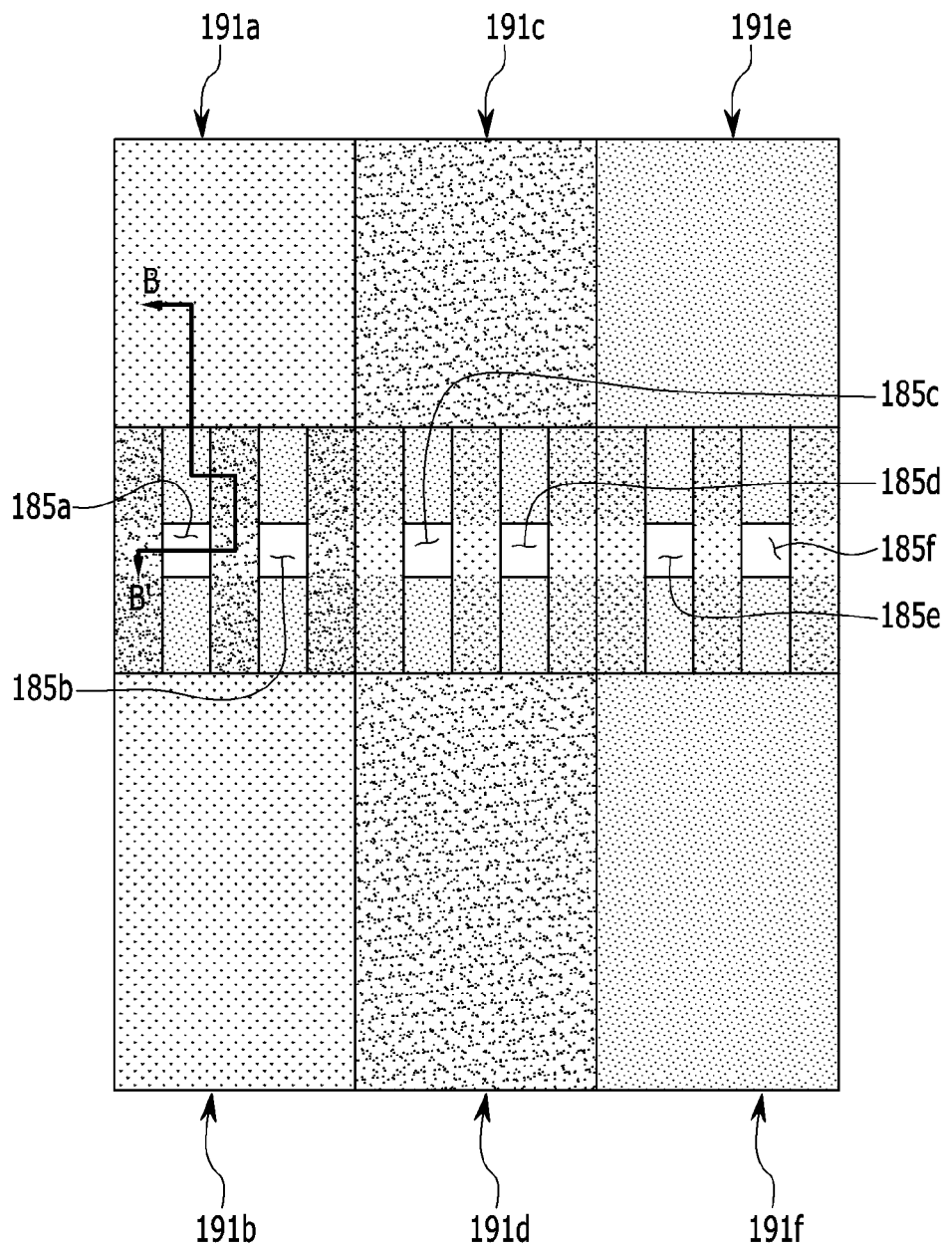
FIG. 5 is a schematic (top) plan view illustrating a structure in a liquid crystal display device that includes a thin film transistor substrate according to an embodiment.
Figure 6:
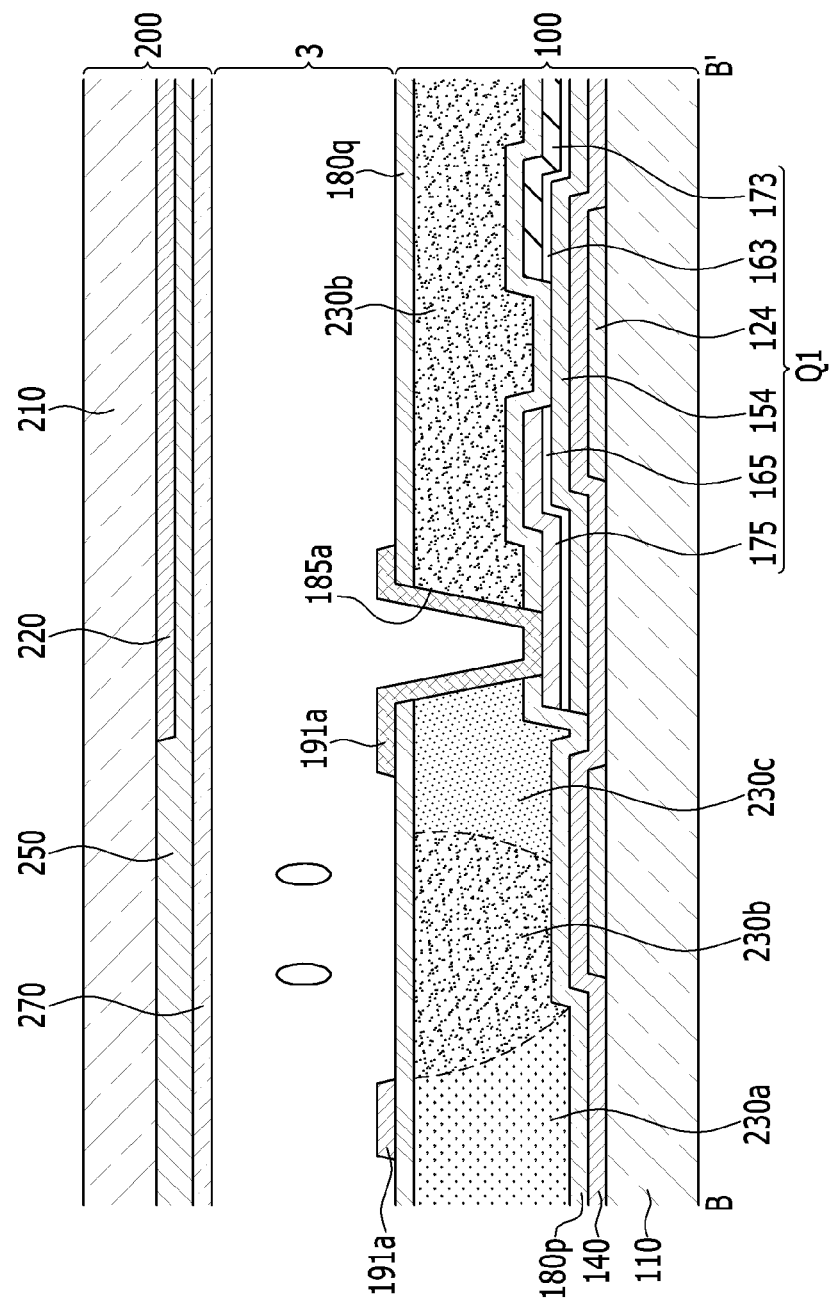
FIG. 6 is a schematic cross-sectional view taken along line B-B' indicated in FIG. 5 according to an embodiment.

FIG. 5 is a schematic (top) plan view illustrating a structure in a liquid crystal display device that includes a thin film transistor substrate according to an embodiment. FIG. 6 is a schematic cross-sectional view taken along line B-B' indicated in FIG. 5 according to an embodiment. The liquid crystal display device discussed with reference to FIG. 5 and FIG. 6 may have one or more of the features discussed above with reference to FIG. 1, FIG. 2, FIG. 3, FIG. 4A, FIG. 4B, and FIG. 4C. The contact holes 185a, 185b, 185c, 185d, 185e, and 185f illustrated in FIG. 5 may have one or more of the features discussed with reference to FIG. 1, FIG. 2, FIG. 3, FIG. 4A, FIG. 4B, and FIG. 4C.

Referring to FIG. 5, each of the contact holes 185a, 185b, 185c, 185d, 185e, and 185f may be surrounded by color filters having and/or corresponding to at least two primary colors and.

As an example, the contact hole 185a may be surrounded by two second-color filters and two third-color filters. The contact hole 185a may be positioned between the two second-color filters in the second direction and may be positioned between the two third-color filters in the first direction.

As another example, the contact hole 185c may be surrounded by two first-color filters and two third-color filters. The contact hole 185c may be positioned between the two first-color filters in the second direction and may be positioned between the two third-color filters in the first direction.

As another example, the contact hole 185e may be surrounded by two first-color filters and two third-color filters. The contact hole 185e may be positioned between the two first-color filters in the second direction and may be positioned between the two third-color filters in the first direction.

Sides of the contact holes 185a, 185b, 185c, 185d, 185e, and 185f may be defined by associated color filters. Dimensions of the contact holes 185a, 185b, 185c, 185d, 185e, and 185f may be designed by configuring distances between associated color filters.

Referring to FIG. 6, the liquid crystal display device includes a lower panel 100 (or thin film transistor substrate 100), an upper panel 200, and a liquid crystal layer 3 disposed between the two panels 100 and 200. The elements 100, 200, and 3 may have one or more of the features discussed with reference to FIG. 1, FIG. 2, FIG. 3, FIG. 4A, FIG. 4B, and FIG. 4C.

A switching element Q1 is positioned on an insulation substrate 110, which may be made of one or more of transparent glass, transparent plastic, etc. A gate layer 124 (or gate electrode 124) of the switching element Q1 is formed on the insulation substrate 110. A gate insulating layer 140 is disposed on the gate layer 124.

A semiconductor 154 is disposed on the gate insulating layer 140. Ohmic contacts 163 and 165 are disposed on the semiconductor 154.

Data conductors including a source layer 173 (or source electrode 173) and a drain layer 175 (or drain electrode 175) may be disposed on the ohmic contacts 163 and 165 and may overlap the gate insulating layer 140.

The data conductors, the semiconductor, and the ohmic contacts may be substantially simultaneously formed in a same process step using one mask.

The switching element Q1 may be a thin film transistor (TFT) that includes the gate layer 124, the source layer 173, and the drain layer 175. A channel of the thin film transistor is positioned in the semiconductor 154 between the source layer 173 and the drain layer 175.

A first passivation layer 180*p* is disposed on the data conductors 173 and 175 and on an exposed portion of the semiconductor 154. The first passivation layer 180*p* may include an inorganic insulating layer formed of an inorganic material, such as silicon nitride or silicon oxide. The first passivation layer 180*p* may prevent a pigment of a color filter form flowing into the exposed portion of the semiconductor 154.

Referring to FIG. 6, FIG. 7A, FIG. 7B, and FIG. 7C, a color filter layer including first-color filters 230*a*, second-color filter 230*b*, third-color filter 230*c*, first-color filters 232*a*, second-color filters 232*b*, and third-color filter 232*c* is disposed on the first passivation layer 180*p*. Thicknesses of the color filters may be different according to respective positions.

For example, the first-color filters 230*a* may have a first thickness and may respectively overlap the subpixel electrodes 191*a* and 191*b*. A second-color filter 232*b* immediately neighboring a first-color filter may have substantially the first thickness, and a third-color filter 232*c* immediately neighboring the second-color filter 232*b* may have substantially the first thickness. A second-color filter 232*b* disposed on another side of the contact hole 185*a* may have a second thickness, which is less than the first thickness.

A second passivation layer 180*q* is disposed on the color filter.

The second passivation layer 180*q* may include an inorganic insulating layer, such as a silicon nitride layer or a silicon oxide layer. The second passivation layer 180*q* may prevent the liquid crystal layer 3 from being contaminated by an organic material (such as a solvent) potentially flowing from the color filter layer, for preventing unwanted effects, such as an afterimage.

The contact hole 185*a* may be positioned through the first passivation layer 180*p* and the second passivation layer 180*q*. The contact hole 185 may expose the drain electrode 175.

Subpixel electrodes, including the subpixel electrodes 191*a* and 191*b*, are disposed on the second passivation layer 180*q*. The subpixel electrodes may be formed of a transparent material, such as ITO or IZO, and/or a reflective material, such as aluminum, silver, chromium, or an alloy of some of these metals.

The subpixel electrode 191*a* is directly and electrically connected to the drain electrode 175 through the contact hole 185. The subpixel electrode 191*a* may receive a data voltage from the drain electrode 175.

The subpixel electrode 191*a* may form an electric field together with a common electrode 270, which is positioned at the upper panel 200, to determine a direction of liquid crystal molecules of the liquid crystal layer 3 between the electrodes 191*a* and 270. Luminance of light passing through the liquid crystal layer 3 may depend on directions of liquid crystal molecules of the liquid crystal layer 3.

A lower alignment layer (not shown) is disposed on the subpixel electrodes. The lower alignment layer may be a vertical alignment layer and may be formed of a polyamic acid, polysiloxane, or polyimide.

A light blocking member 220 is positioned on an insulation substrate 210, which may be made of at least one of transparent glass, transparent plastic, etc. The light blocking member 220 may be a black matrix and may prevent light leakage.

The light blocking member 220 may substantially cover the transistor Q1 and the contact hole 185, may extend parallel to a gate line, and may overlap at least a portion of two data lines positioned at two sides of one pixel area. The light blocking member 220 may prevent light leakage around data lines and gate lines and may prevent light leakage in a region where the transistor Q1 is disposed.

An overcoat 250 may be positioned on the black matrix 220. The overcoat 250 may be made of an (organic) insulating material and may provide a flat surface. The overcoat 250 may be omitted. The common electrode 270 is positioned on the overcoat 250.

An upper alignment layer (not shown) is formed on the common electrode 270. The upper alignment layer may be a vertical alignment layer.

The liquid crystal layer 3 has a negative dielectric constant anisotropy. Major axes of the liquid crystal molecules may be oriented perpendicular to outer surfaces of the two panels 100 and 200 when no electric field is applied to the liquid crystal layer 3.

Figure 7A:
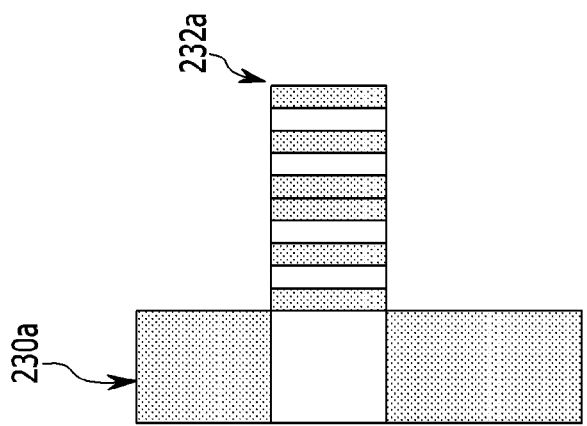
FIG. 7A, FIG. 7B, and FIG. 7C are schematic (top) plan views illustrating steps in a method for manufacturing a thin film transistor substrate according to an embodiment.
Figure 7B:
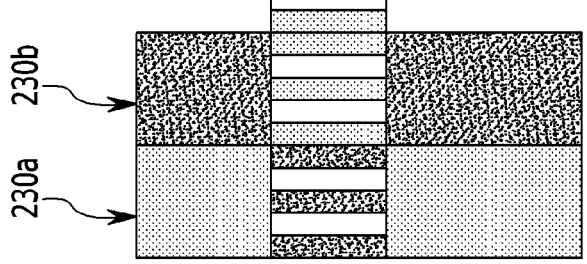
Figure 7C:
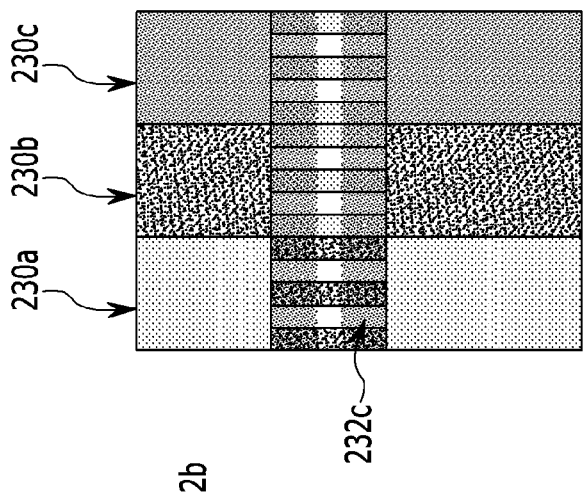

FIG. 7A, FIG. 7B, and FIG. 7C are schematic (top) plan views illustrating steps in a method for manufacturing the lower panel 100 (or thin film transistor substrate 100) according to an embodiment.

Referring to FIG. 7A, through a first mask process, two first-color filter 230*a* are respectively formed at regions corresponding to the subpixel electrodes 191*a* and 191*b* of the first pixel, and first-color filters 232*a* are formed at regions corresponding to switching elements of the second pixel and the switching elements of the third pixel, such that the first-color filters 231*a* overlap the switching elements of the second pixel and the switching elements of the third pixel.

The two first-color filters 230*a* may be aligned in the first direction (e.g., a pixel column direction). The first-color filters 232*a* may be first-color strips, may be distributed along the second direction, may each extend in the first direction, may extend parallel to each other, and/or may be spaced from each other.

The first mask process may include the following steps: providing a photosensitive first-color resin on the first passivation layer 180*p* (and/or on the substrate 110); positioning a first mask on the first-color resin; applying a first light through the first mask to the first-color resin; and completely or partially removing portions of the first-color resin that have been exposed to the first light.

The first mask may include first-set substantially opaque portions and first-set substantially transparent portions.

The first-set substantially opaque portions may shield portions of the first-color resin that form the first-color filters 230*a* and the first-color filters 232*a*. Therefore, the first-color filters 230*a* and the first-color filters 232*a* may remain after the first mask process.

The first-set substantially transparent portions may substantially expose the following portions of the first-color resin to the first light: portions of the first-color resin between the first-color filters 230*a*; portions of the first-color resin between the first-color filters 232*a*; and portions of the first-color resin corresponding to the subpixels 191*c*, 191*d*, 191*e*, and 191*f*. The substantially exposed portions may be substantially removed through the first mask process.

Referring to FIG. 7B, through a second mask process, two second-color filters 230*b* are formed at regions corresponding to the subpixel electrodes 191*c* and 191*d* of the second pixel, and second-color filters 231*b* are formed at a region corresponding to switching elements of the first pixel, such that the second-color filters 232*b* overlap the switching elements of the first pixel.

The two second-color filters 230*b* may be aligned in the first direction (e.g., a pixel column direction). The second-color filters 232*b* may be positioned between the two first-color filters 230*a*, may be second-color strips, may extend in the first direction, may be distributed along the second direction, may extend parallel to each other, and/or may be spaced from each other.

The second mask process may include the following steps: providing a photosensitive second-color resin on the first-color filters 230*a* and 232*a* and exposed portions of the first passivation layer 180*p* (and/or on the substrate 110); positioning a second mask on the second-color resin; applying a second light through the second mask to the second-color resin; and completely or partially removing portions of the second-color resin that have been exposed to the second light.

The second mask may include second-set substantially opaque portions and second-set substantially transparent portions.

The second-set substantially opaque portions may shield portions of the second-color resin that form the two second-color filters 230*b* and the second-color filters 232*b*. Therefore, the two second-color filters 230*b* and the second-color filters 232*b* may remain after the second mask process.

The second-set substantially transparent portions may substantially expose the following portions of the second-color resin to the second light: portions of the second-color resin positioned at regions corresponding to switching elements of the second pixel and switching elements of the third pixel; portions of the second-color resin between the second-color filters 232*b*; and portions of the second-color resin corresponding to subpixels 191*a*, 191*b*, 191*e*, and 191*f*. The substantially exposed portions may be substantially removed through the second mask process.

Referring to FIG. 7C, through a third mask process, two third-color filter 230*c* are formed at regions corresponding to the subpixel electrodes 191*e* and 191*f* of the third pixel, and third-color filters 232*c* are formed at regions corresponding to the switching elements of the first pixel, the switching elements of the second pixel, and the switching elements of the third pixel, such that the third-color filters 232*c* overlap the switching elements.

The two third-color filters 230*c* may be aligned in the first direction (e.g., a pixel column direction). A first portion of the third-color filters 232*c* may be positioned between the first-color filters 230*a*, may be third-color strips, may extend in the first direction, may be distributed along the second direction, may extend parallel to each other, and/or may be spaced from each other; holes corresponding to the contact holes 185*a* and 185*b* may be formed between the first portion of third-color filters 232*c*. A second portion of the third-color filters 232*c* may be positioned between the second-color filters 230*b*; holes corresponding to the contact holes 185*c* and 185*d* may be formed between the second portion of third-color filters 232*c*. A third portion of the third-color filters 232*c* may be positioned between the third-color filters 230*c*; holes corresponding to the contact holes 185*e* and 185*f* may be formed between the third portion of third-color filters 232*c*.

The third mask process may include the following steps: providing a photosensitive third-color resin on the color filters 230*a*, 232*a*, 230*b*, 232*b*, and exposed portions of the first passivation layer 180*p* (and/or on the substrate 110); positioning a third mask on the third-color resin; applying a third light through the third mask to the third-color resin; and completely or partially removing portions of the third-color resin that have been exposed to the third light.

The third mask may include third-set substantially opaque portions and third-set substantially transparent portions.

The third-set substantially opaque portions may shield portions of the third-color resin that form the two third-color filters 230*c* and the third-color filters 232*c*. Therefore, the two third-color filters 230*c* and the third-color filters 232*c* may remain after the third mask process.

The third-set substantially transparent portions may substantially expose the following portions of the third-color resin to the third light: portions of the third-color resin corresponding to the contact holes 185*a*, 185*b*, 185*c*, 185*d*, 185*e*, and 185*f*; portions of the third-color resin between the third-color filters 232*c*; and portions of the third-color resin corresponding to subpixels 191*a*, 191*b*, 191*c*, and 191*d*. The substantially exposed portions may be substantially removed through the third mask process.

As can be appreciated from the above discussion with reference to FIG. 5, FIG. 6, FIG. 7A, FIG. 7B, and FIG. 7C, through the first mask process, the second mask process, and the third mask process, color filters 230*a*, 230*b*, and 230*c* are formed at regions corresponding to pixel electrodes 191*a*, 191*b*, 191*c*, 191*d*, 191*e*, and 191*f* of pixels; color filters 232*a*, 232*b*, and 232*c* are formed at regions corresponding to switching elements of the three pixels; and the contact holes 185*a*, 185*b*, 185*c*, 185*d*, 185*e*, and 185*f* may be formed in and/or between the color filters 232*a*, 232*b*, and 232*c*.

Figure 8:
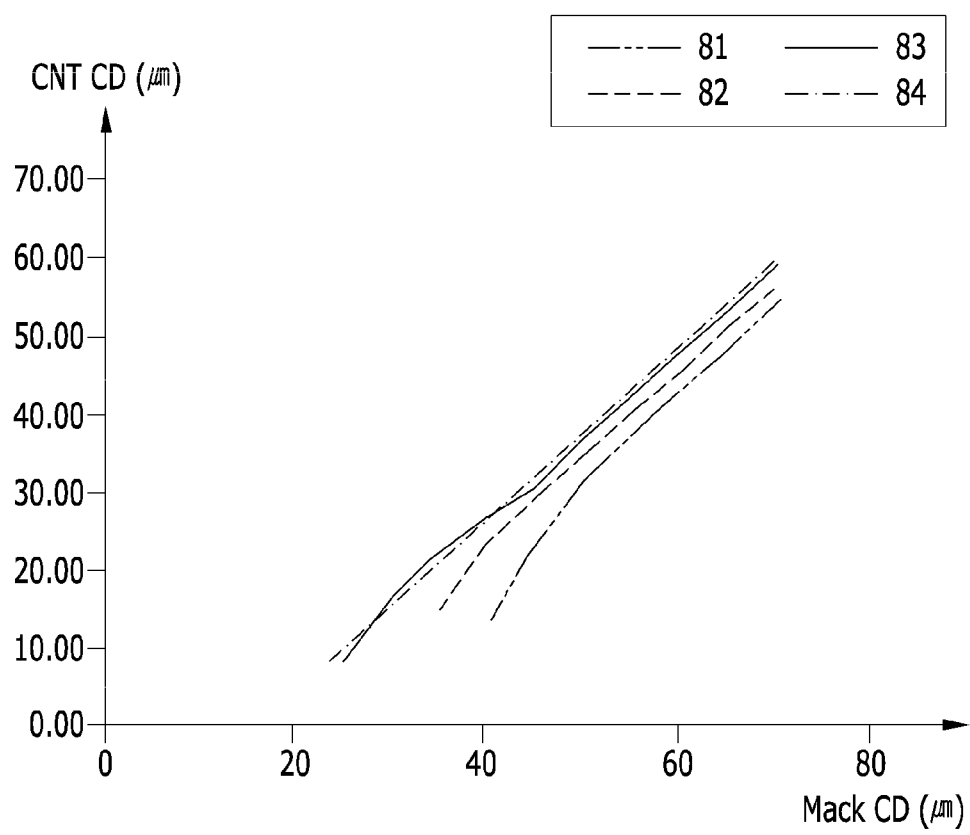
FIG. 8 is a graph showing a critical dimension value of a mask for forming a contact hole and a critical dimension value of the contact hole according to an embodiment.

FIG. 8 is a graph showing a critical dimension value of a mask for forming a contact hole and a critical dimension value of the contact hole according to an embodiment.

A graph of FIG. 8 may be shown in Table 1.

TABLE 1

| CNT | MASK CD | | | | | | | | |
|---|---|---|---|---|---|---|---|---|---|
| | Rectangular Intaglio | | | Circular Intaglio | | | Embodiment | | |
| CD | R | G | B | R | G | B | R | G | B |
| 70 | 56.37 | 57.35 | 54.90 | 54.90 | 55.39 | 52.45 | 60.096 | 60.292 | 58.528 |
| 65 | 51.47 | 52.45 | 49.02 | 49.02 | 49.51 | 46.08 | 54.508 | 54.082 | 52.842 |
| 60 | 46.08 | 47.06 | 44.61 | 43.63 | 44.12 | 40.69 | 48.92 | 49.312 | 47.156 |
| 55 | 41.18 | 41.18 | 38.24 | 37.75 | 38.73 | 34.80 | 43.332 | 43.822 | 41.47 |
| 50 | 35.78 | 37.76 | 33.33 | 31.86 | 31.86 | 27.94 | 37.744 | 38.332 | 35.784 |
| 45 | 29.90 | 30.88 | 27.94 | 23.53 | 25.00 | 17.65 | 31.37 | 32.35 | 29.41 |
| 40 | 24.01 | 25.00 | 19.61 | 13.73 | 16.67 | | 26.96 | 27.45 | 24.51 |

TABLE 1-continued

| | MASK CD | | | | | | | | |
|---|---|---|---|---|---|---|---|---|---|
| CNT | Rectangular Intaglio | | | Circular Intaglio | | | Embodiment | | |
| CD | R | G | B | R | G | B | R | G | B |
| 35 | 15.20 | 16.67 | 11.27 | | 4.41 | | 21.57 | 22.55 | 19.61 |
| 30 | | 6.86 | | | | | 16.18 | 16.67 | 13.73 |
| 25 | | | | | | | 8.82 | 10.29 | 6.37 |

As shown Circular Intaglio in Table 1 and lines 81, 84 in FIG. 8, as a critical dimension value of a mask for forming a circular contact hole is decreased, a reduction ratio of a critical dimension value of the circular contact hole is increased.

Also as shown Rectangular Intaglio in Table 1 and lines 82, 84 in FIG. 8, as a critical dimension value of a mask for forming a rectangular contact hole is decreased, a reduction ratio of a critical dimension value of the rectangular contact hole is increased.

In a process of forming a color filter, interference of light is generated due to a mask. The interference light may increase the reduction ratio of the critical dimension value of the contact hole. Therefore, it is difficult to design the critical dimension of the mask, for forming a contact hole of a small critical dimension value.

In contrast, as shown Embodiment in Table 1 and lines 83, 84 in FIG. 8, when the critical dimension value is reduced, the reduction ratio of the critical dimension value of the contact hole is generally constant.

According to embodiments, contact holes may be formed through color filter formation process steps (without significant additional steps). Advantageously, efficiency associated with a process for manufacturing a transistor substrate and/or a process for manufacturing a display device may be optimized.

According to embodiments, locations and dimensions of contact holes may be determined by configuring locations and distances between color filters. Advantageously, precision of contact hole locations and dimensions may be optimized.

While embodiments have been described, possible embodiments are not limited to the described embodiments. Embodiments are intended to cover various modifications and equivalent arrangements within the spirit and scope of the appended claims.

What is claimed is:

1. A transistor substrate comprising:
   a transistor; and
   a set of color filters that has at least two different colors, overlaps the transistor, and defines a hole, the hole exposing a portion of the transistor,
   wherein the set of color filters comprises a first first-color filter and a first second-color filter, wherein a color of the first first-color filter is different from a color of the first second-color filter, wherein the first first-color filter defines a first side of the hole in a plan view of the transistor substrate, wherein the first second-color filter defines a second side of the hole in the plan view of the transistor substrate, and wherein the first first-color filter is longer than the first second-color filter according to a first direction.

2. The transistor substrate of claim 1, further comprising:
   a pixel electrode that overlaps the set of color filters, wherein a portion of the pixel electrode is positioned inside the hole, directly contacts the color filters, and directly contacts the portion of the transistor.

3. The transistor substrate of claim 1, wherein the first first-color filter directly abuts the first second-color filter in the plan view of the transistor substrate.

4. The transistor substrate of claim 3, wherein the first side of the hole and the second side of the hole are two straight sides in the plan view of the transistor substrate.

5. The transistor substrate of claim 3, wherein each of the first first-color filter and the first second-color filter is positioned between two display-area color filters in the plan view of the transistor substrate, wherein the first first-color filter directly abuts each of the two display-area color filters in the plan view of the transistor substrate, wherein each of the two display-area color filters is wider than each of the first first-color filter and the first second-color filter according to a second direction, and wherein the second direction is perpendicular to the first direction.

6. The transistor substrate of claim 5, wherein a thickness of one of the two display-area color filters is unequal to at least one of a thickness of the first first-color filter and a thickness of the first second-color filter.

7. The transistor substrate of claim 3, wherein the set of color filter further comprises a second first-color filter, wherein the second first-color filter directly abuts the first second-color filter in the plan view of the transistor substrate, wherein the second first-color filter defines a third side of the hole in the plan view of the transistor substrate, and wherein the hole and the first second-color filter are positioned between the first first-color filter and the second first-color filter in the plan view of the transistor substrate.

8. The thin film transistor substrate of claim 7, wherein the set of color filter further comprises a second second-color filter, wherein the second second-color filter is positioned between the first first-color filter and the second first-color filter in the plan view of the transistor substrate, wherein the second second-color filter directly abuts each of the first first-color filter and the second first-color filter in the plan view of the transistor substrate, and wherein the second second-color filter defines a fourth side of the hole in the plan view of the transistor substrate.

9. The transistor substrate of claim 3, wherein the first first-color filter overlaps a gate electrode of the transistor.

10. A method for manufacturing a transistor substrate, the method comprising:
    forming a transistor on a base substrate; and
    forming a set of color filters that has at least two different colors, overlaps the transistor, and defines a hole, the hole exposing a portion of the transistor,
    wherein the set of color filters comprises a first first-color filter and a first second-color filter, wherein a color of the first first-color filter is different from a color of the first second-color filter, wherein the first first-color filter defines a first side of the hole in a plan view of the transistor substrate, wherein the first second-color filter defines a second side of the hole in the plan view of the transistor substrate, and wherein the first side of the hole and the second side of the hole are two straight sides in the plan view of the transistor substrate.

11. The method of claim 10, further comprising:
forming a pixel electrode that overlaps the set of color filters, wherein a portion of the pixel electrode is positioned inside the hole, directly contacts the color filters, and directly contacts the portion of the transistor.

12. The method of claim 10, wherein the first first-color filter directly abuts the first second-color filter in the plan view of the transistor substrate, and wherein the first side of the hole is not parallel to the second side of the hole in the plan view of the transistor substrate.

13. The method of claim 12, wherein the first first-color filter is longer than the first second-color filter according to a first direction.

14. The method of claim 12, comprising: forming two display-area color filters, wherein each of the first first-color filter and the first second-color filter is positioned between the two display-area color filters in the plan view of the transistor substrate, wherein the first first-color filter directly abuts each of the two display-area color filters in the plan view of the transistor substrate, wherein each of the two display-area color filters is wider than each of the first first-color filter and the first second-color filter according to a second direction, and wherein the second direction is perpendicular to the first direction.

15. The method of claim 14, wherein a thickness of one of the two display-area color filters is unequal to at least one of a thickness of the first first-color filter and a thickness of the first second-color filter.

16. The method of claim 14, wherein a thickness of one of the two display-area color filters is equal to a sum of a thickness of the first first-color filter and a thickness of the first second-color filter.

17. The method of claim 14, wherein a color of the two display-area filters is different from each of the color of the first first-color filter and the color of the first second-color filter.

18. The method of claim 12, wherein the first first-color filter overlaps a gate electrode of the transistor.

19. A display device comprising:
a first transistor;
a first first-color filter;
a first second-color filter, which directly abuts the first first-color filter in a plan view of the display device, wherein a color of the first first-color filter is different from a color of the first second-color filter;
a first subpixel electrode, which directly contacts each of the first transistor, the first first-color filter, and the first second-color filter;
a second transistor;
a second second-color filter, which directly abuts the first first-color filter in the plan view of the display device, wherein a color of the second second-color filter is identical to a color of the first second-color filter; and
a second subpixel electrode, which directly contacts each of the second transistor, the first first-color filter, and the second second-color filter.

20. The method of claim 10, wherein the two straight sides form an angle that is greater than 0 degree and less than 180 degrees in the plan view of the transistor substrate.

* * * * *